(12) United States Patent
Hellberg

(10) Patent No.: US 6,462,682 B2
(45) Date of Patent: Oct. 8, 2002

(54) SAMPLE RATE CONVERSION METHOD AND APPARATUS

(75) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/818,121

(22) Filed: Mar. 27, 2001

(65) Prior Publication Data

US 2001/0037351 A1 Nov. 1, 2001

(30) Foreign Application Priority Data

Mar. 27, 2000 (SE) .............................................. 0001079

(51) Int. Cl.[7] .............................................. H03M 7/00
(52) U.S. Cl. ........................................ 341/61; 708/313
(58) Field of Search ............................. 341/61, 50, 51; 708/313

(56) References Cited

U.S. PATENT DOCUMENTS

| | | | | |
|---|---|---|---|---|
| 5,023,825 A | | 6/1991 | Luthra et al. ............ 364/724.1 |
| 5,502,747 A | * | 3/1996 | McGrath ..................... 375/350 |
| 5,774,598 A | * | 6/1998 | Sunshine et al. ........... 382/250 |
| 5,814,750 A | | 9/1998 | Wang et al. .................. 84/602 |
| 6,000,834 A | * | 12/1999 | Duan ......................... 708/313 |
| 6,115,113 A | * | 9/2000 | Flockencier ............... 356/5.01 |

OTHER PUBLICATIONS

T.I. Laakso et al., "Splitting the Unit Delay—Tools for Fractional Delay Filter Design", IEEE Signal Processing Magazine, Jan. 1996, pp. 30–60.

T.A. Ramstad, "Digital Methods for Conversion Between Arbitrary Sampling Frequencies", IEEE Trans. Acoustics, Speech and Signal Processing, vol. ASSP–32, No. 3, Jun. 1984, pp. 577–591.

A. Oppenheim and R. Schafer, "Discrete–Time Signal Processing", Prentice Hall, 1989, pp. 548–560.

R. E. Blahut, "Fast Algorithms for Digital Signal Processing", Addison–Wesley, Inc., 1984, pp. 65–109, 176–186, 292–295.

R.W. Adams and T. Kwan, "A Monolithic Asynchronous Sample–Rate Converter for Digital Audio", IEEE International Symposium on Circuits and Systems, Jul. 1993, pp. 1963–1966.

I.–S. Lin and S.K. Mitra, "Overlapped Block Digital Filtering", IEEE Transactions on Circuits and Systems, vol. 43, No. 8, Aug. 1996, pp. 586–596.

* cited by examiner

Primary Examiner—Peguy JeanPierre
(74) Attorney, Agent, or Firm—Burns, Doane, Swecker & Mathis, L.L.P.

(57) ABSTRACT

An arbitrary sample rate conversion apparatus is described. This apparatus includes a buffer for forming blocks of input samples having a first sample rate. For each block of input samples a subfilter is selected from a polyphase filter. Each block of input samples is convolved with the corresponding selected subfilter for producing blocks of output samples having a second sample rate.

24 Claims, 8 Drawing Sheets

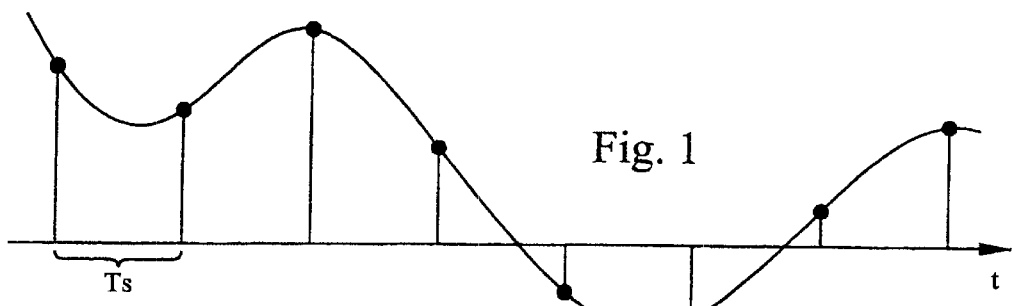
Fig. 1
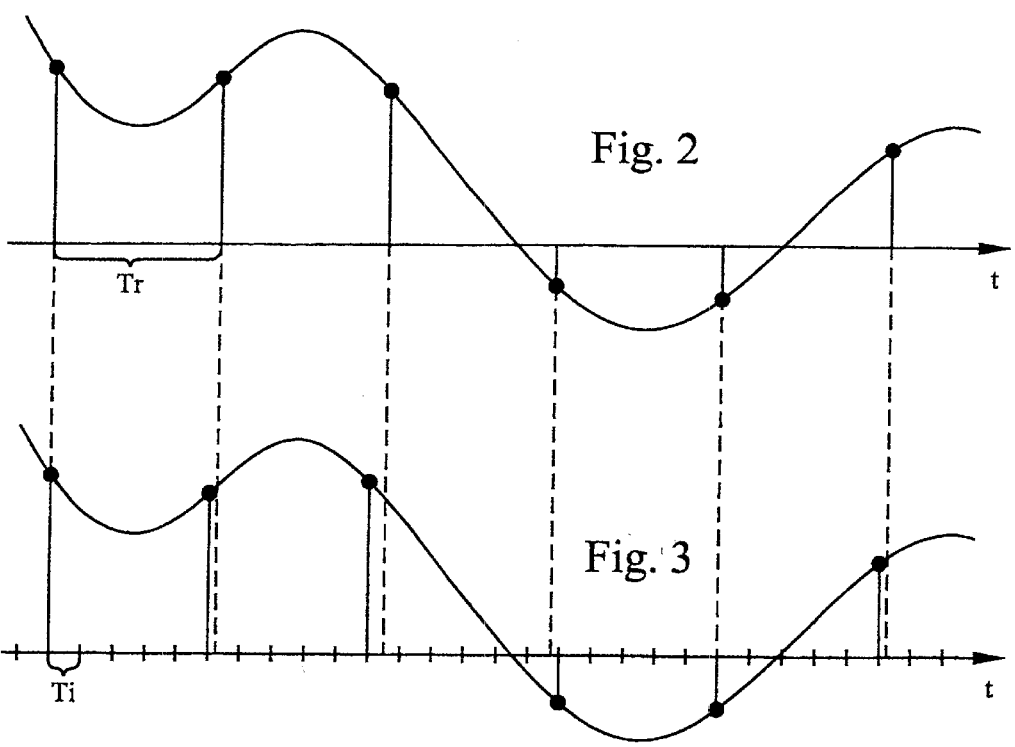
Fig. 2
Fig. 3
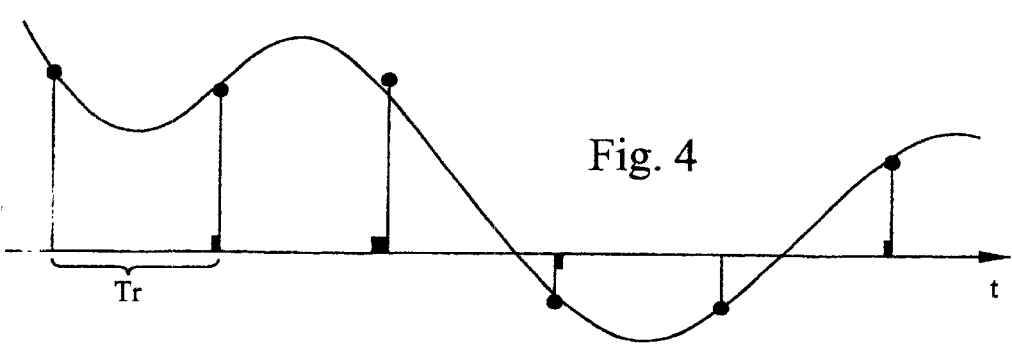
Fig. 4

SAMPLE RATE CONVERSION METHOD AND APPARATUS

TECHNICAL FIELD

The present invention relates to a sample rate conversion method and apparatus.

BACKGROUND

Sample rate conversion, or resampling, is used when digital systems of different sample rates have to be connected. When the sample rates of the systems to be connected are related in a simple way, for example by integer or fractional factors, exact resampling can be used. In many cases, however, there are no simple relations between the sample rates of the systems. In these cases it is necessary to use non-exact resampling, or arbitrary sample rate conversion.

In certain applications there are several systems with differing sample rates that share common hardware. The common hardware can then often be designed so that its sample rate is related in a simple way to one of the systems, but not all. However, it is also often desirable to keep the sample rate of the common hardware somewhat independent of the other sample rates, in order to retain a degree of freedom in the design and optimization of the common hardware (such as optimizing the sample rate of an analog-to-digital converter). An example is digital IF (Intermediate Frequency) processing for multi-standard radio communication.

The two most commonly used solutions for resampling are polynomial interpolation and polyphase FIR (finite impulse response) filters, see [1]–[3].

Polynomial interpolation, or N-th order interpolation, is a way of computing output samples in-between input samples using polynomials. Lagrange interpolation is a well known polynomial interpolation scheme suitable for resampling. Typically zero-order and first-order Lagrange interpolation is used. A drawback of polynomial interpolation is that it often has poor spectral properties [1]. Another drawback of the polynomial method is that it involves a high computational load.

Polyphase FIR filters techniques (see [3], for example) for resampling applications consist of arranging a highly oversampled FIR filter (many coefficients) into several sets, branches or subfilters, and for each output use a different set of filter coefficients for multiplying the input samples. The set of filter coefficients used for a specific output sample represent a fractional delay filter with a delay equal to the delay between the time of an available input sample and the time of the desired output sample. The delay is kept track of by counters or 'timing NCOs' (NCO=numerically controlled oscillator). Usually the delay is represented as an integer part, telling which input sample range to use, and a fractional part, telling which subfilter to use. Ideally, for non-rational resampling ratios, infinitely many branches or subfilters are needed for representing all possible delays, but in practice a limited (but large) number of branches are used, approximating all possible delay values with the closest delay available (sample and hold). The error in doing this is the main design tradeoff in this type of resampling. The polyphase method is characterized by having larger memory requirements but somewhat lower computational load than the polynomial method. However, the computational load is still high, and it would be desirable to reduce this load further.

These two methods can also be combined, greatly reducing the number of coefficients needed at the expense of increasing the computational load. When combining polyphase filtering with first-order (linear) interpolation, two 'raw' output samples have to be computed for each linearly interpolated output sample, increasing the computational load to twice that of the polyphase filter method itself plus the multiplications needed for the linear interpolation (one per output sample).

SUMMARY

An object of the present invention is an arbitrary sample rate conversion method and apparatus that are less computationally intense than the prior art.

This object is achieved in accordance with the attached claims.

Briefly, the present invention solves this object by providing a technique that is based on polyphase filters, but provides several consecutive output samples from the same subfilter and input sample block by using block convolution. This reduces the computational load. A reduced computational load is especially attractive in a mobile radio communication environment, where it may be exploited for reducing the power consumption, which in turn results in better battery utilization.

BRIEF DESCRIPTION OF THE DRAWINGS

The invention, together with further objects and advantages thereof, may best be understood by making reference to the following description taken together with the accompanying drawings, in which:

FIG. 1 is a time diagram of an analog signal sampled at a first sampling rate;

FIG. 2 is a time diagram of the analog signal in FIG. 1 sampled at a second sampling rate;

FIG. 3 is a time diagram of the analog signal in FIG. 1 sampled at the available subfilter delays;

FIG. 4 is a time diagram of the analog signal in FIG. 1, in which the samples of FIG. 3 have been shifted to the correct delays of the second sampling rate;

DETAILED DESCRIPTION

Before the invention is described in detail, the polyphase filtering technique will be described with reference to FIGS. 1–4.

FIG. 1 is a time diagram of an analog signal sampled at a first sampling rate. The sampling time period is denoted Ts.

FIG. 2 is a time diagram of the analog signal in FIG. 1 sampled at a second sampling rate. This sampling rate is close to the first sampling rate, and the sampling time period is denoted Tr. The samples illustrated in FIG. 2 are the exact samples that would be obtained if the analog signal had been sampled with the second sampling rate. However, this is not possible, since in connection with resampling the analog signal is no longer available. Instead only the samples from FIG. 1 are available. The technical problem to be solved is to convert the available samples into the samples in FIG. 2. In practice this is not possible, at least not for arbitrary sample rate conversions. One approximate method that is often used is the polyphase filter method. According to this method, the sampling time period Ts is divided into a number of delays (indicated by the tick marks in FIG. 3) separated by a time period Ti. Each delay is associated with a subfilter of a polyphase filter. The purpose of each subfilter is to reconstruct (interpolate) the value of the analog signal at the corresponding delay from a range of samples in FIG. 1. As is indicated by the dashed lines between FIGS. 2 and 3, the available delays do not always coincide with the desired resample delays. In such cases the closest interpolated sample is used as an approximation. The selected interpolated samples are indicated in FIG. 3.

FIG. 4 is a time diagram of the analog signal in FIG. 1, in which the interpolated samples of FIG. 3 have been shifted to the correct positions of the second sampling rate. The corresponding shifts have been indicated by thick line segments.

A drawback of this prior art method is that it is computationally intense, since each output sample has to be calculated separately from a range of input samples and a subfilter.

The basic principles of the present invention will now be described with reference to FIGS. 5–8.

Figure 5:
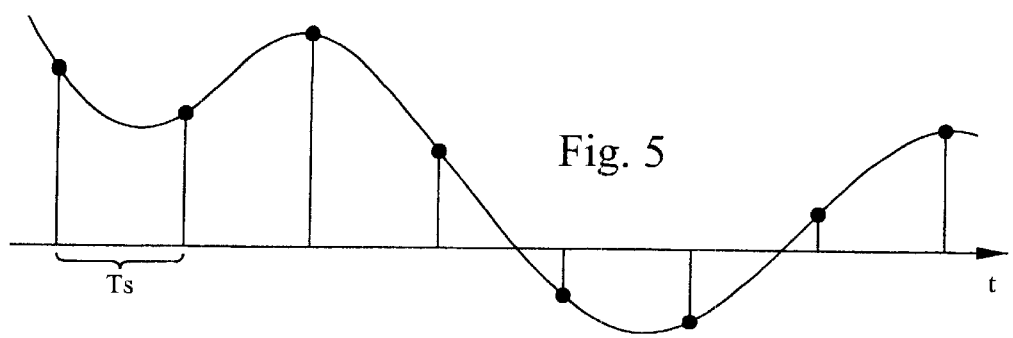
FIG. 5 is a time diagram of an analog signal sampled at a first sampling rate corresponding to the time diagram in FIG. 1.
Figure 6:
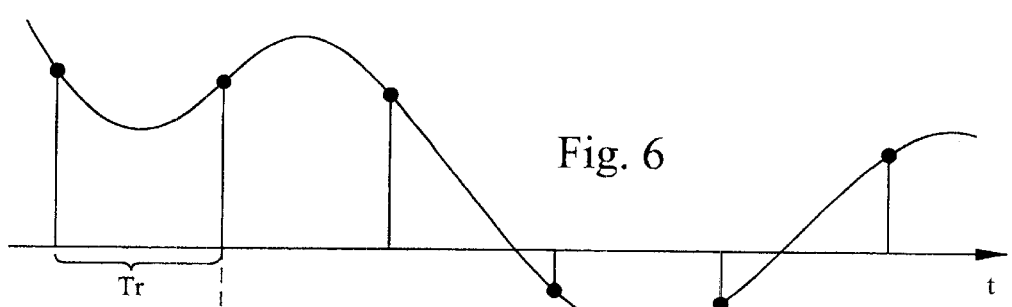
FIG. 6 is a time diagram of the analog signal in FIG. 5 sampled at a second sampling rate.

FIG. 5 is a time diagram of an analog signal sampled at a first sampling rate corresponding to the time diagram in FIG. 1. FIG. 6 is a time diagram, similar to FIG. 2, of the analog signal in FIG. 5 sampled at a second sampling rate.

Figure 7:
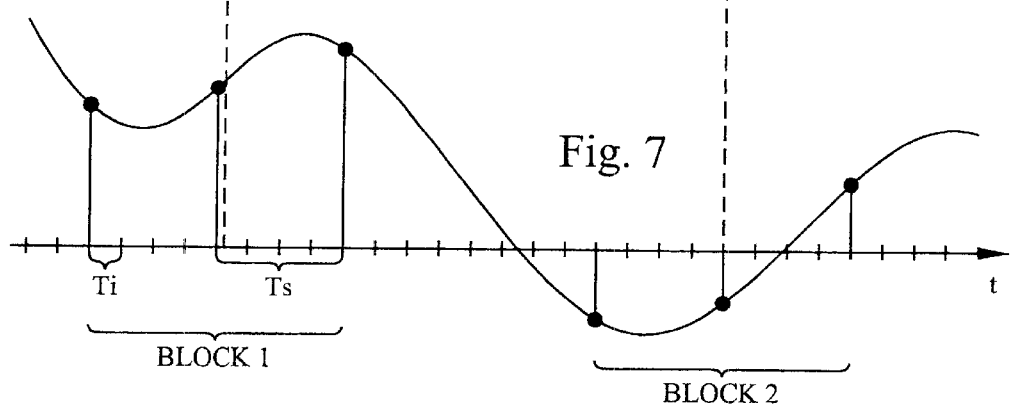
FIG. 7 is a time diagram of the analog signal in FIG. 5 illustrating a first step of the method in accordance with the present invention.

FIG. 7 is a time diagram of the analog signal in FIG. 5 illustrating a first step of the method in accordance with the present invention. Each sample period Ts is divided into delays separated by a time period Ti, as in the prior art method. As previously, each delay is associated with a subfilter of a polyphase filter. However, instead of calculating each output sample separately from a block of input samples and a subfilter, as in the prior art method, the present invention calculates a block of output samples from the same block of input samples and subfilter in an operation called block convolution. The concept of block convolution will be further described below. The selected subfilter that corresponds to an output sample block is the subfilter that has the delay closest to the center of the output block. In FIG. 7 two such output blocks (BLOCK 1 and BLOCK 2), each comprising 3 output samples, have been indicated. It is noted that the samples within an output block are separated by the original sampling time period Ts. This is a consequence of the block convolution. It is also noted that all the samples of an output block have the correct values in these positions.

Figure 8:
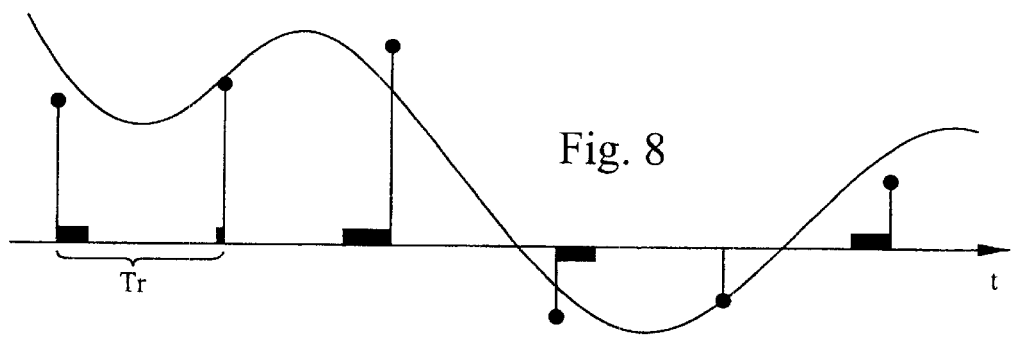
FIG. 8 is a time diagram of the analog signal in FIG. 5 illustrating a second step of the method in accordance with the present invention.

FIG. 8 is a time diagram of the analog signal in FIG. 5 illustrating a second step of the method in accordance with the present invention. In this step the samples determined in the block convolution are redistributed to the desired resampling positions. Thus, the present invention may be summarized as follows: First it produces blocks of output samples having correct values, but slightly incorrect delays (FIG. 7), and then it redistributes these samples to obtain correct delays but slightly incorrect values (FIG. 8).

The limited number of polyphase branches (subfilters) in the prior art contributes an error to each sample (thick lines segments in FIG. 4) since the time of the calculated output sample is slightly offset from the correct time. By allowing such a timing error also from another source (block convolution), output samples may, according to the present invention, be grouped with a slightly erroneous spacing as long as this error does not grow too large within the block of samples. Whole blocks of output samples are calculated by a filter algorithm, in which a subfilter represents the same delay for a whole block. The delay is optimized so that the total error is as low as possible, i.e. the center of the block generally has the (at least approximately) correct delay, with the error growing to the sides. The output sample stream now represents a slightly non-uniformly spaced set of samples that are redistributed to the desired positions.

The additional timing error, that arises from calculating the output samples in groups, can be traded off against the timing error that stems from the limited number of polyphase branches. This is because these two timing errors have almost the same appearance when translated into amplitude errors. The amplitude error generally decreases by 6 dB for each halving of the timing error. It can therefore be seen that, for a resampling ratio close to one, i.e. input rate slightly larger or smaller than the output rate, the number of consecutive samples that can be grouped together with maintained error level increases as the difference between the two rates decreases. This aspect will be discussed further below.

Figure 9:
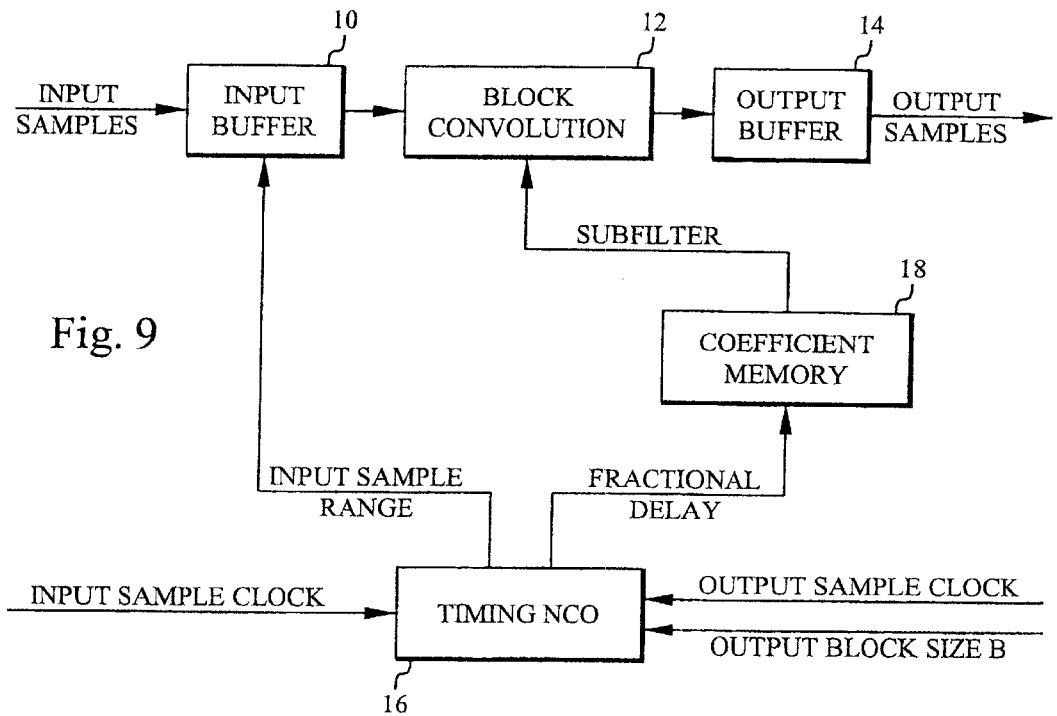
FIG. 9 is a block diagram of an exemplary embodiment of a sample rate conversion apparatus in accordance with the present invention.

FIG. 9 is a block diagram of an exemplary embodiment of a sample rate conversion apparatus in accordance with the present invention. An input buffer 10 receives input samples separated by a first sampling period Ts. Input sample blocks from input buffer 10 are forwarded to a block convolution unit 12, in which they are convolved by corresponding subfilters of a polyphase filter. The resulting output sample blocks are forwarded to an output buffer 14, from which samples are outputted separated by the second sampling period Tr. A timing NCO 16 (Numerically Controlled Oscillator) selects an input sample block from input buffer 10 and a corresponding subfilter from a coefficient memory 18. Timing NCO 16 is controlled by an input sample clock, an output sample clock and an output block size.

Since block convolution is an essential feature of the present invention, the next few paragraphs will briefly explain this technique (it is described in detail in [4]).

When performing block convolution two major methods are used, overlap-add and overlap-save. The overlap-add method sections the input into non-overlapping blocks, filters each block by performing a linear convolution (which increases its length), and pads the output together by adding the overlapping parts together. Overlap-save instead produces non-overlapping output blocks by convolving overlapping input blocks with the filter coefficients, producing only the output samples needed for the block. Computationally these methods are comparable, using the same amount of multiplications but slightly different amounts of additions. Both methods can also be used in block-based resampling. Both methods are described in detail in [4].

When used for block-based resampling, however, the methods have differences in what the approximation error looks like. For overlap-save, the output blocks are non-overlapping and the input sample blocks are long enough to produce all necessary output points, so the error comes from approximating the desired output samples with samples that are slightly incorrect in time. Overlap-add produces long overlapping output segments that have to be patched together with samples from previous and later segments, but the input segments are short. The end points of the output segments in the overlap-add method will have larger timing errors than in overlap-save, since they are farther from the center of the block than in the overlap-save method (they will however have lower weight since the filter generally is tapered towards the ends). For these reasons it seems that overlap-save should be preferred, due to the lower error. Generally, fast convolution algorithms for use with the overlap-add method can be changed into equally efficient algorithms for overlap-save, and vice versa.

Figure 10:
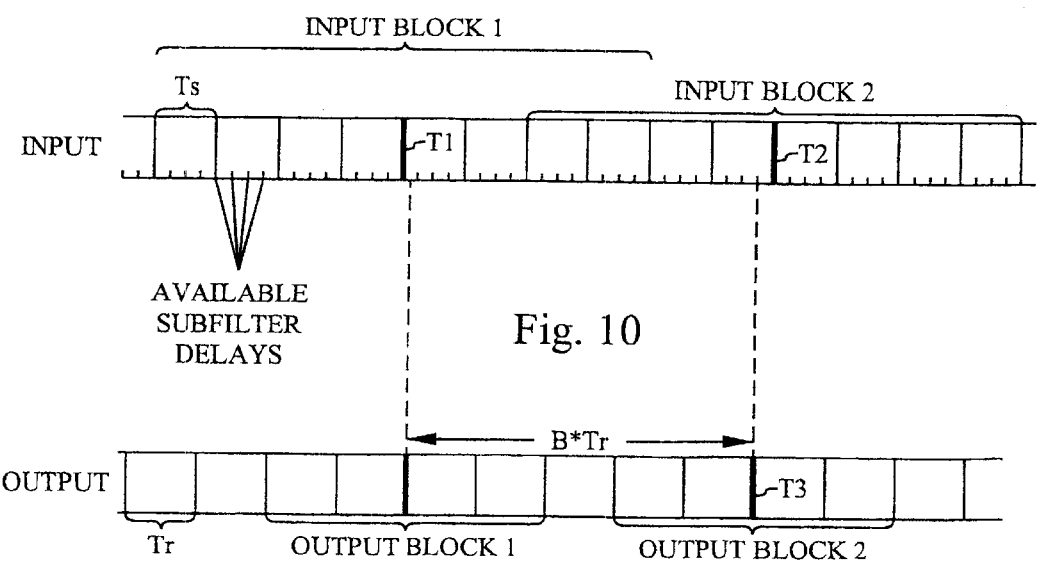
FIG. 10 is a time diagram illustrating the timing calculations that are necessary for resampling in accordance with the method of the present invention.

FIG. 10 is a time diagram illustrating the timing calculations that are necessary for resampling in accordance with the method of the present invention. When blocks of samples are computed together in the resampler, timing NCO 16 must be implemented to support this property. This is suggested in FIG. 9, in which the output block size B is a parameter that is input to timing NCO 16. The basic function of this NCO is to keep track of the input and output sample times, and to translate this difference into a parameter that selects the correct subfilter coefficients (correct delay) for this difference. For each output block an output timing register of NCO 16 is increased by the output block size B multiplied by the sample time Tr in the output time scale. The difference between the integer reference point T1 of the input range for the last block and the closest input sample at T2 that could be a new reference point tells how many samples to skip forward on the input for the next group of samples. The difference between the actual time T3 of a (time-correct) output sample and the selected integer reference point is the fractional delay, which is used to select a subfilter for correcting that timing difference. The input reference point and the input block length together define the input sample range (FIG. 9). For the overlap-save method the input block length is determined from the output block length and the subfilter length in accordance with the formula:

*InputBlockLength=OutputBlockLength+SubfilterLength−1*

An output block length of 5 samples and a filter length of 5 taps gives an input length of 9 samples, as illustrated in FIG. 10. It is noted that the input blocks overlap each other.

Figure 11:
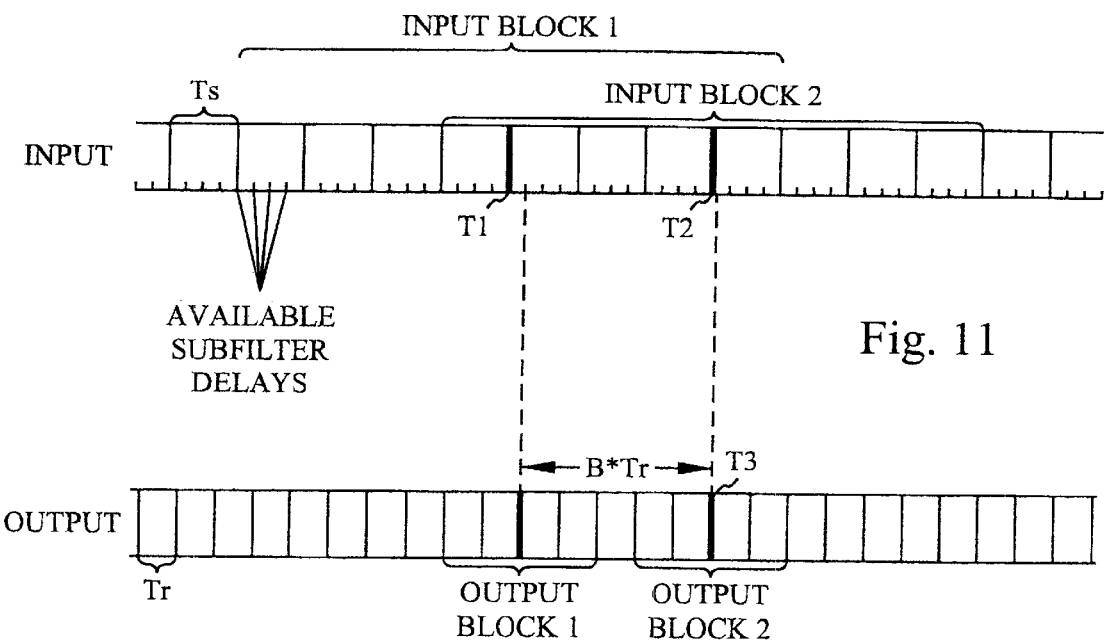
FIG. 11 is another time diagram illustrating the timing calculations that are necessary for resampling in accordance with the method of the present invention.

FIG. 11 is another time diagram illustrating the timing calculations that are necessary for resampling in accordance with the method of the present invention. While the diagram in FIG. 10 illustrated down sampling by a factor close to unity, FIG. 11 illustrates illustrated up sampling by a factor close to 2. The calculations by timing NCO 16 are performed in the same way as in FIG. 10.

Figure 12:
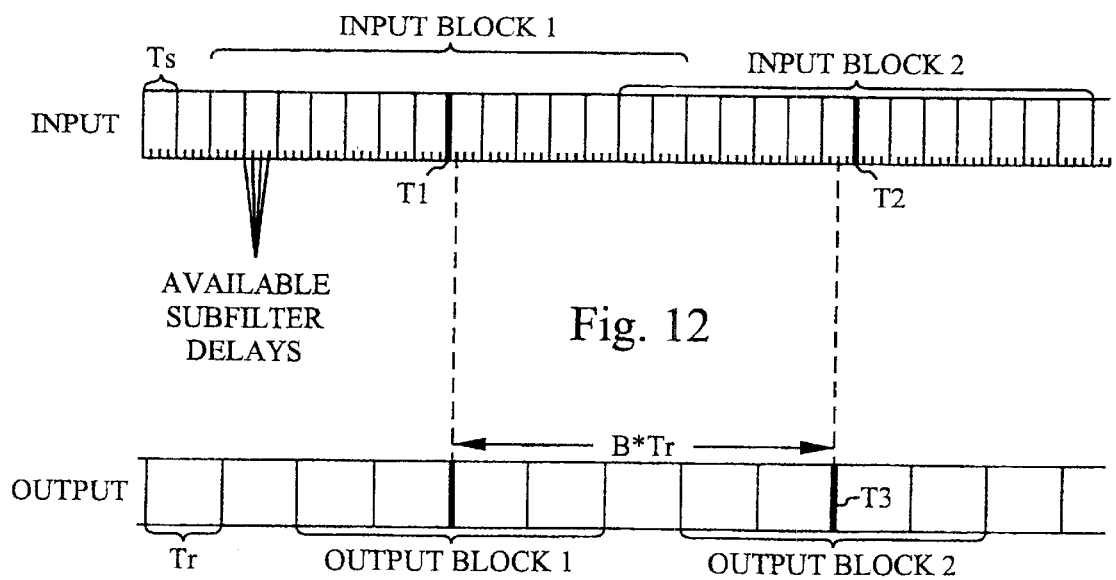
FIG. 12 is still another time diagram illustrating the timing calculations that are necessary for resampling in accordance with the method of the present invention.

FIG. 12 is still another time diagram illustrating the timing calculations that are necessary for resampling in accordance with the method of the present invention. This example illustrates down sampling by a factor that is not close to unity. The calculations by timing NCO 16 are performed in the same way as in FIG. 10. In this example an output block length of 5 samples requires a longer input sample block, for example 15 samples, as illustrated in the figure. The reason for this is that the input sample block should cover the time interval that includes the corresponding output sample block.

Figure 13:
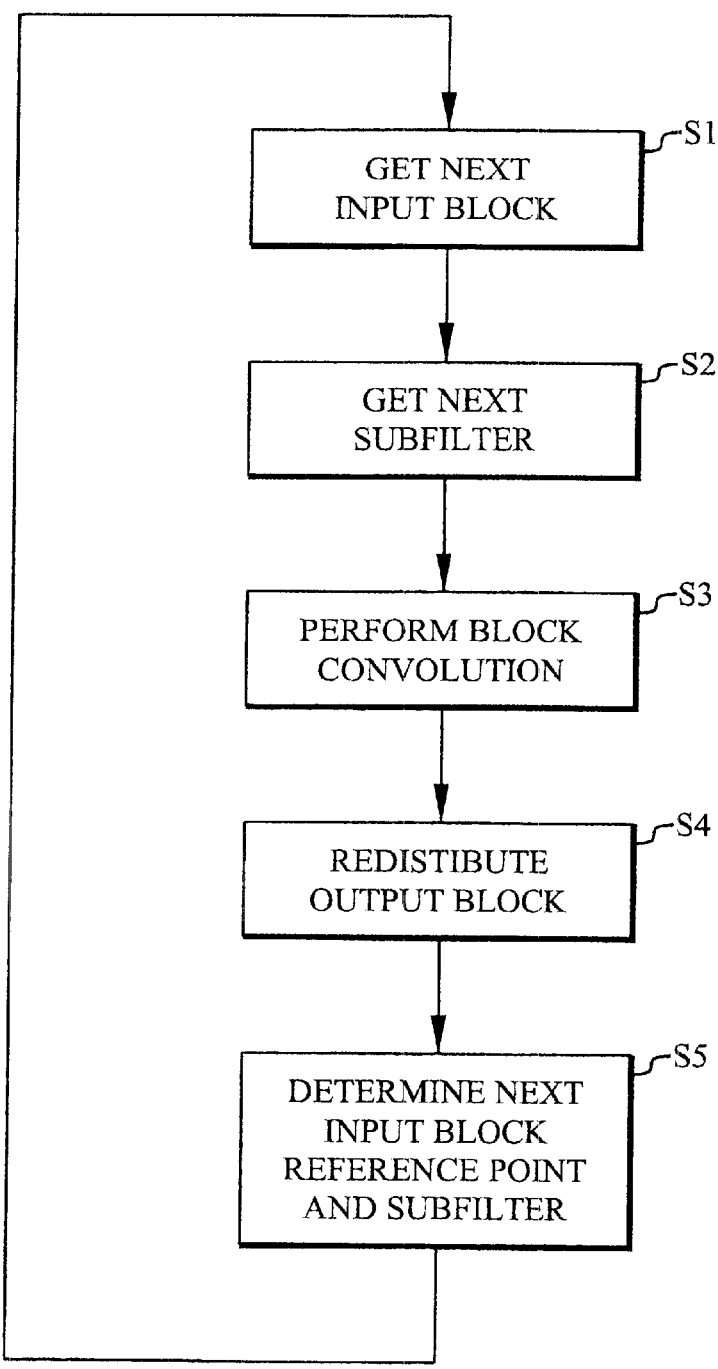
FIG. 13 is a flow chart illustrating an exemplary embodiment of the block-based resampling method in accordance with the present invention.

FIG. 13 is a flow chart illustrating an exemplary embodiment of the block-based resampling method in accordance with the present invention. In step S1 the next input sample block is obtained from buffer 10 in FIG. 9. Step S2 obtains the corresponding subfilter. Step S3 performs the block convolution. Step S4 redistributes the samples of the output block at the new sample rate. Step S5 determines the next input block reference and subfilter. Thereafter the procedure returns to step S1 to process the next input block.

Many of the previous paragraphs have dealt with the possibility to group output samples together at an (slightly incorrect) exact rational ratio to the input samples and the error in doing so. The reason for doing this, in spite of the larger errors associated, is because better algorithms for the filtering process can be used. The ordinary polyphase FIR resampler needs as many multiplications per output sample as there are taps in the individual filter branches (subfilters). If a solution can be found that calculates groups of samples instead of individual samples, various block-based convolution algorithms, known collectively as fast convolution algorithms, can be used for the filter calculations.

The optimum (in terms of number of multiplications) algorithm for computing n outputs from a r-tap FIR filter uses r+n−1 multiplications, see [5]. Optimum algorithms such as the Cook-Toom algorithms, Winograd short convolution algorithms and modified variants of these with fewer additions are derived, and for some lengths also given explicitly, in the above reference. These algorithms have the lowest number of multiplications possible. The optimum algorithms generally transform the convolution of the input block d with the filter coefficients g0 . . . gr, which in matrix form can be written s=Td, where T contains different shifts of the filter coefficient set, into the form s=CGAd. C and A are pre- and post-addition matrices, respectively, which generally contain mostly ones, zeros and minus ones, and G is a diagonal matrix with r+n−1 elements which are additive combinations of g0 . . . gr.

It is appreciated that, since the complexity of the optimum algorithms for convolution is r+n−1, the number of multiplications per output sample will be (r+n−1)/n, i.e. the complexity decreases with an increase in the input sample block length n. This means that it is very favourable (in terms of computational load) to increase the number of samples that can be collectively processed.

The fast convolution algorithms are often given in the form of linear convolution, to be used with the overlap-add method. For obtaining algorithms for filter sections for use with the overlap-save method the Transformation Principle can be applied, which gives a filter section algorithm of the same complexity as the linear convolution algorithm, see [5].

For small numbers of r and n there exist good algorithms with the optimum complexity, but as the numbers grow the numbers of additions in these optimum algorithms get too large. For higher r and n there is the possibility to iterate algorithms for small subfilters, in order to limit the growth in number of additions. These algorithms have higher multiplicative complexity than the optimum algorithms, but a lot less additions. The derivation of the iteration consists of partitioning the convolution matrix into smaller blocks, restate the problem as a convolution of matrices and use a good algorithm (the same ones as for the convolutions by scalars) for this convolution, see [5]. The number of multiplications per output sample for different lengths of these algorithms follow the expression $r^x$, where r is the number of taps in the filter, and r/n is constant. The number x=0.585 for an algorithm based on an iterated optimal 2*2 convolution algorithm (r=2, n=2), and x=0.404 for an algorithm based on 4*4 convolution. This is much lower than the standard FIR filter used in prior art resampling. The number of additions are in some cases a little higher than in the standard FIR filter, and in some cases lower instead.

The time-domain convolution can be computed in the frequency domain by using a fast Fourier transform (FFT) on overlapping groups of input samples, doing pointwise multiplications with a discrete Fourier transform of the filter coefficients and performing a fast inverse Fourier transform (IFFT) on the product vector. This procedure has asymptotically $O(\log(r))$ multiplications per sample, and will be better than the iterated algorithms for very long filter and block lengths, but since we are often interested in relatively short lengths, a figure must be obtained individually for every case. FFT-based convolution is simpler when the data is complex, since the FFT is naturally a complex-input complex-output system.

Another possibility for efficient computation of convolution is by using number-theoretic transforms (NTTs). These transforms have the convolution property similar to FFTs, which reduces the convolution to computing pointwise products in the transform domain. For some lengths these transforms can be computed without multiplications, using only additions, subtractions and bit shifts. Since the only multiplications are the multiplications in the transform domain, the number of multiplications is low. The drawback is that all computations are modulo a Fermat number, which limits the resolution. Within this range, however, all computations are exact.

Any cyclic convolution algorithm can be used with the overlap-add and overlap-save methods. A possibility is to use Winograd short cyclic convolution algorithms or bind together several Winograd short cyclic convolution algorithms into larger convolutions using the Agarwal-Cooley algorithm [5]. Although not optimal, it is still a lot better than the standard FIR filter algorithms.

The fast convolution algorithms outlined above can lower the number of multiplications needed for the filter sections by large amounts. A comparison between the prior art implementation and some optimal (Winograd) and iterated convolution algorithms is given in Table 1 below.

TABLE 1

| Filter length, | 3, | 3, | 4, | 5, | 8, | 9, | 25, |
|---|---|---|---|---|---|---|---|
| Block length | 2 | 3 | 4 | 3 | 8 | 9 | 9 |
| Prior art | 3 | 3 | 4 | 5 | 8 | 9 | 25 |
| Winograd | 2 | 1.67 | 1.75 | 2.33 | 1.88 | 1.89 | 3.67 |
| Iterated, 2*2 | | | 2.25 | | 3.28 | | |
| Iterated, 3*3 | | | | | | 2.78 | |
| Iterated5*3 | | | | | | | 5.44 |

FFT-based convolution was introduced as a way of getting rational resampling into the block-based resampling algorithm, and is obviously not as good for the shortest filter- and block lengths as the optimal and iterated algorithms. It is primarily intended for increasing the flexibility and applicability of block-based resampling. At longer lengths it is however better than the iterated algorithms. The FFT-based convolution is compared to the standard algorithm in Table 2.

TABLE 2

| Transform size, | 8, | 12, | 16, | 16, | 32, | 32, |
|---|---|---|---|---|---|---|
| Filter length, | 5, | 7, | 8, | 9, | 16, | 17, |
| Block length | 5 | 6 | 9 | 8 | 17 | 16 |
| Prior art | 5 | 7 | 8 | 9 | 16 | 17 |
| FF7-based | 4 | 5.67 | 4.89 | 5.5 | 6.82 | 7.25 |

Figure 14:
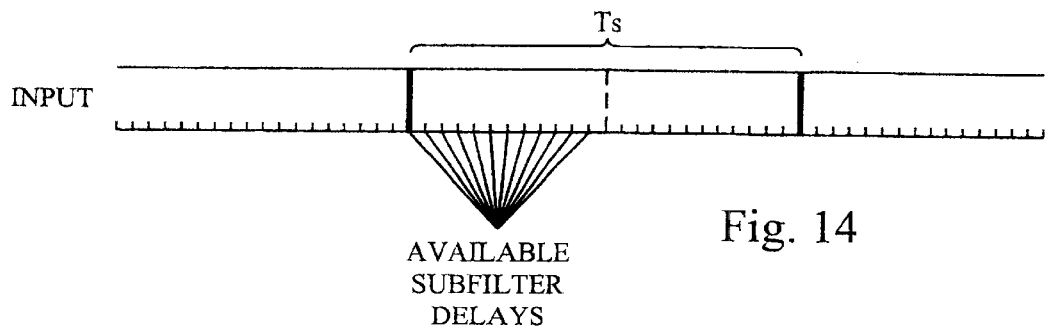
FIG. 14 is a time diagram illustrating an embodiment of the present invention that exploits filter symmetry to reduce memory requirements.

FIG. 14 is a time diagram illustrating an embodiment of the present invention that exploits filter symmetry to reduce memory requirements. If the subfilters are symmetrical (around the middle coefficients) it is possible to reuse the same subfilters for delays above Ts/2. However, the filter representations used by the fast convolution algorithms typically do not use the filter coefficients directly. Instead combinations of filter coefficients are pre-computed and stored. These combinations typically do not have the same symmetry. However it is possible to pre-compute and store these combinations for only half the subfilters and still obtain the same result. The trick is to reverse the sample order in both input and output blocks for the second half of subfilter delays. In this way the same subfilter may be used for the fractional delays $\Delta$ and Ts $\Delta$. This reduces the memory requirements by 50%. The fact that the methods are equivalent may be illustrated mathematically by the following example:

For a 3 tap subfilter [g1, g2, g3] and a 5 sample input block [x1, x2, x3, x4, x5] the convolution results in the output block $$y_1 = x_1 g_1 + x_2 g_2 + x_3 g_3$$

$$y_2 = x_2 g_1 + x_3 g_2 + x_4 g_3$$

$$y_3 = x_3 g_1 + x_4 g_2 + x_5 g_3$$

Consider the same convolution expressed in matrix form $$\underbrace{\begin{pmatrix} y_1 \\ y_2 \\ y_3 \end{pmatrix}}_{\text{output block}} = \underbrace{\begin{pmatrix} g_1 & g_2 & g_3 & 0 & 0 \\ 0 & g_1 & g_2 & g_3 & 0 \\ 0 & 0 & g_1 & g_2 & g_3 \end{pmatrix}}_{\text{subfilter}} \underbrace{\begin{pmatrix} x_1 \\ x_2 \\ x_3 \\ x_4 \\ x_5 \end{pmatrix}}_{\text{input block}} = \begin{pmatrix} x_1 g_2 + x_2 g_2 + x_3 g_3 \\ x_2 g_2 + x_3 g_2 + x_4 g_3 \\ x_3 g_1 + x_4 g_2 + x_5 g_3 \end{pmatrix}$$

Reversing the input block gives $$\underbrace{\begin{pmatrix} g_1 & g_2 & g_3 & 0 & 0 \\ 0 & g_1 & g_2 & g_3 & 0 \\ 0 & 0 & g_1 & g_2 & g_3 \end{pmatrix}}_{\text{unchanged subfilter}} \underbrace{\begin{pmatrix} x_5 \\ x_4 \\ x_3 \\ x_2 \\ x_1 \end{pmatrix}}_{\substack{\text{reversed}\\\text{input}\\\text{block}}} = \begin{pmatrix} x_5 g_1 + x_4 g_2 + x_3 g_3 \\ x_4 g_1 + x_3 g_2 + x_2 g_3 \\ x_3 g_1 + x_2 g_2 + x_1 g_3 \end{pmatrix}$$

On the other hand, keeping the input block unchanged and reversing the subfilter to [g3, g2, g1] instead gives the output block $y_1 = x_1 g_3 + x_2 g_2 + x_3 g_1$ $y_2 = x_2 g_3 + x_3 g_2 + x_4 g_1$ $y_3 = x_3 g_3 + x_4 g_2 + x_5 g_1$ which is clearly the same result, but in reverse order.

Figure 15:
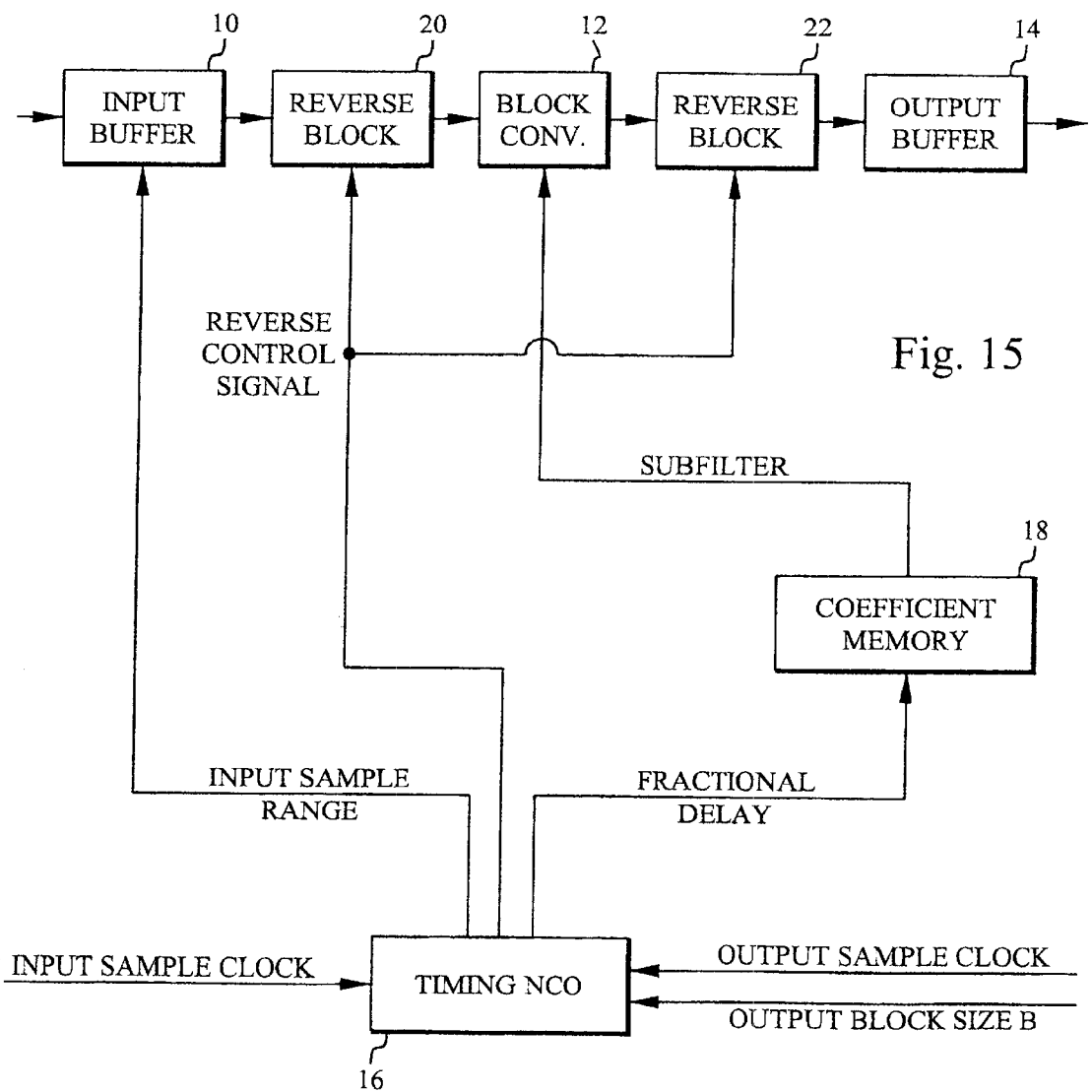
FIG. 15 is a block diagram of an exemplary embodiment of a sample rate conversion apparatus in accordance with the present invention suitable for exploiting the symmetry discussed with reference to FIG. 14.

FIG. 15 is a block diagram of an exemplary embodiment of a sample rate conversion apparatus in accordance with the present invention suitable for exploiting the symmetry discussed with reference to FIG. 14. In addition to the elements of the embodiment in FIG. 9, this embodiment has two units 20 and 22 for reversing the order of the samples in the input and output blocks, respectively. These block reversing units are controlled by the same reverse control signal from timing NCO 16. If the determined fractional delay falls below Ts/2 no block reversing is performed. Otherwise the input sample block is reversed before block convolution, and then the output sample block is reversed after block convolution. Thereafter steps S4 and S5 are performed as previously.

Figure 16:
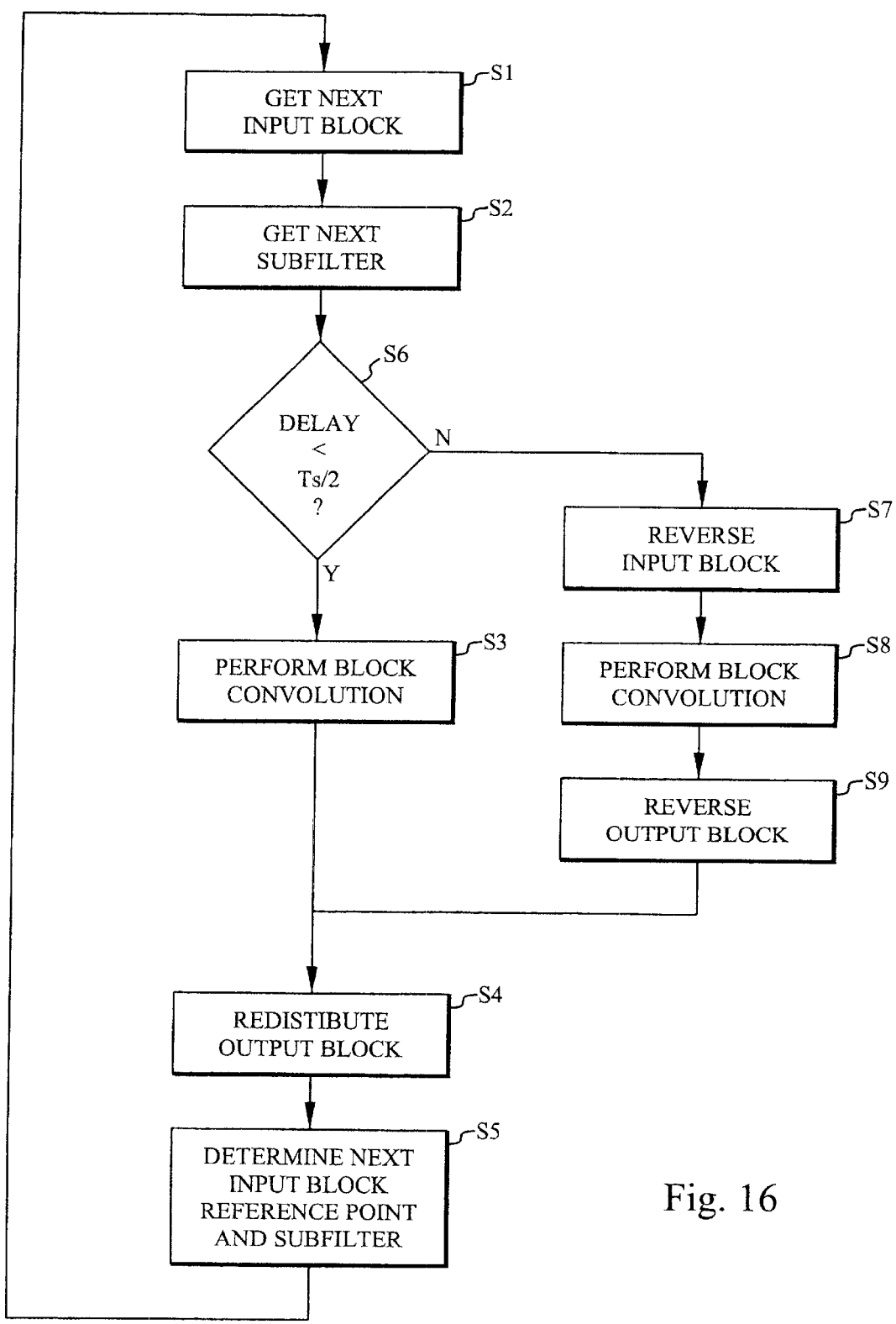
FIG. 16 is a flow chart illustrating an exemplary embodiment of the block-based resampling method in accordance with the present invention suitable for exploiting the symmetry discussed with reference to FIG. 14.

FIG. 16 is a flow chart illustrating an exemplary embodiment of the block-based resampling method in accordance with the present invention suitable for exploiting the symmetry discussed with reference to FIG. 14. This embodiment differs from the embodiment in FIG. 13 in that a test S6 is performed before the block convolution in step S3. Step S6 tests whether the delay is less than Ts/2. If so, step S3 is performed. Otherwise, step S7 reverses the input block, step S8 performs the block convolution on the reversed block and step S9 reverses the output block.

For an FFT-based fast convolution algorithm, another symmetry in the representation of the filters (in the discrete Fourier domain) can be exploited if the prototype filter is symmetrical. This is because the discrete Fourier transform (DFT) of two representations of the same prototype filter, with equal positive and negative time-shifts, respectively, will only differ in the direction (negative or positive) of the incremental phase shift of the DFT bins. This can further be interpreted (if the phase of the prototype filter is zero) such that the two representations only differ in the sign of the imaginary components of the DFT bins. In this way, only half of the values need to be stored, and the other half are obtained by negating the imaginary components of the first half. The symmetry of the magnitudes of the frequency samples of the filters can also be exploited, if the center (DC) component is given zero phase. Then the two (symmetrical) halves of the individual frequency responses can be obtained from the same half frequency response by negating the imaginary components. With both of these methods combined, only a fourth of all coefficients have to be stored.

As has been noted above, the additional timing error that arises from calculating the output samples in groups, can be traded off against the timing error that stems from the limited number of polyphase branches. This is because these two timing errors have almost the same appearance when translated into amplitude errors. The amplitude error generally decreases by 6 dB for each halving of the timing error. It can therefore be seen that, for an example resampling ratio close to one, i.e. input rate slightly larger or smaller than the output rate, the number of consecutive samples that can be grouped together with maintained error level increases as the difference between the two rates decreases.

Figure 17:
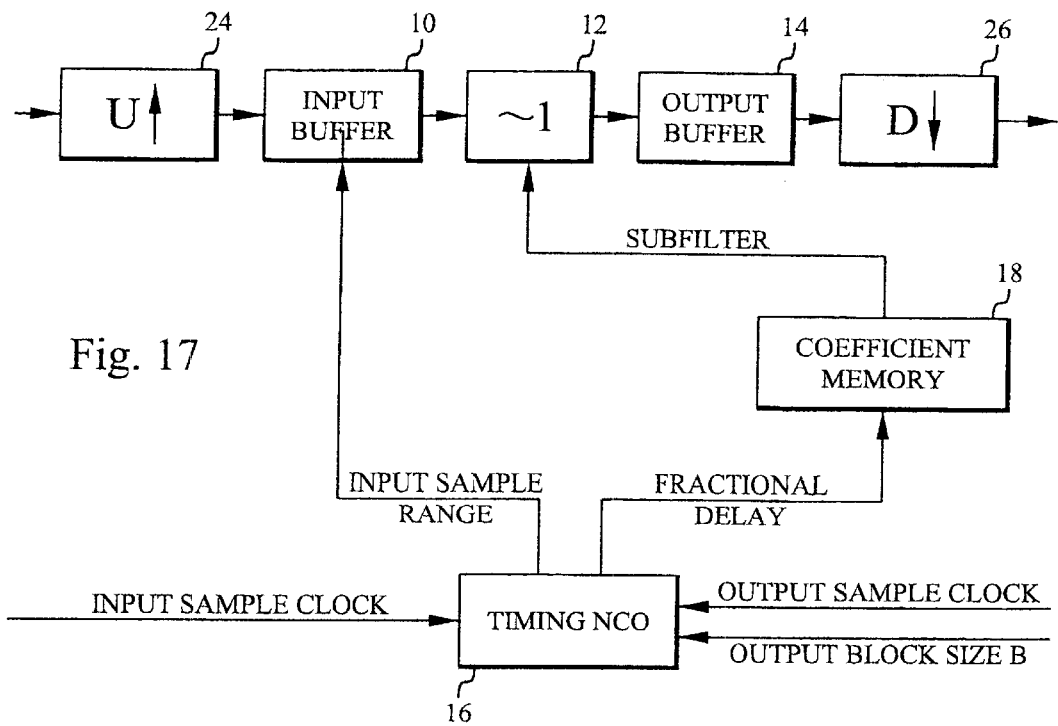
FIG. 17 is a block diagram of another exemplary embodiment of a sample rate conversion apparatus in accordance with the present invention.

To cope with resampling rates that are not close to unity, and still be able to calculate output samples in groups with low error, an exact resampling by a rational number can be included in the filtering algorithm. An alternative way for accomplishing the same objective is to perform this exact resampling outside the non-exact resampling algorithm, i.e. before and/or after, to leave only a resampling by a number close to unity in the non-exact resampling algorithm. Such an embodiment is illustrated in FIG. 17. In this embodiment an interpolator 24 inserts an integer number U of interpolated (exact) samples between every pair of input samples. After resampling by a factor close to unity in block convolution unit 12, a decimator 25 removes every D:th sample from the output stream. When to chose one alternative or the other depends on how easy it is to include the rational resampling in the respective filter section algorithms.

Figure 18:
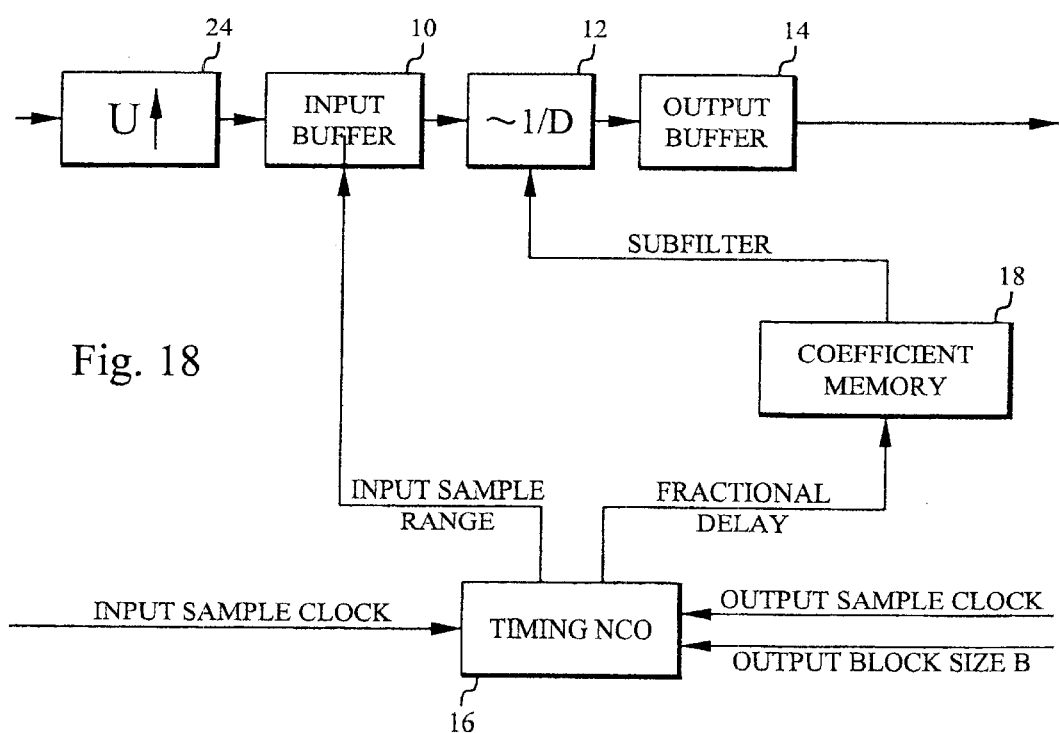
FIG. 18 is a block diagram of still another exemplary embodiment of a sample rate conversion apparatus in accordance with the present invention.

A further alternative is to do part of the exact resampling outside the non-exact resampling algorithm, in order to only leave an easy factor, for example a small integer D, in the non-exact resampling algorithm. Such an embodiment is illustrated in FIG. 18. This embodiment includes a separate interpolator, as in FIG. 17, but the decimation is included in the block convolution in unit 12.

Efficient algorithms for decimating and interpolating filter sections can be obtained by breaking the convolution into parts that can be treated independently, then applying efficient algorithms for the parts. For example, a five-tap, three-output decimate-by-two filter section can be broken into a 3*3 filter section and a 3*2 filter section that can be independently computed. In general, a decimating or interpolating filter can be broken into the same number of independent parts as the decimation or interpolation factor. These parts can be computed at the lower of the input and output rates. This way of including decimation and interpolation by integer factors can be used with all of the efficient convolution algorithms mentioned earlier.

A special case is the fast convolution based on FFTs. An algorithm exists for including arbitrary rational factor resampling in FFT based fast convolution, which is well suited for use in block-based resampling. This algorithm makes possible the use of any length FFT on either side of the algorithm, which in effect gives a rational factor sample rate change by the input transform length divided by the output transform length. The overlap (and hence the block length) is also largely variable, which eases the use of the algorithm for block-based resampling. In a practical implementation, the overlap on either the input or output end could be a fixed number of samples.

This algorithm can be adapted for use as the convolution algorithm in block-based resampling through adding a varying time-shift to the blocks. This time-shift, which will be provided by the timing NCO, will then be added to the shift that is already included in the algorithm for time-aligning the blocks. In effect, the time-alignment is 'disturbed' by a controlled amount, such that the input samples are systematically delayed by an increasing or decreasing amount per block. This is different from the original algorithm, in which the time shifts necessary to align the blocks measured up to zero after a certain number of blocks.

The tradeoff that has been made possible by the invention has so far been described as, for a given filter length, an increased resampling error is traded for a lower computational complexity. This is useful if the total error is small enough when using the standard method and the filter length is sufficient. If the error is large because we were using a too short filter, one can instead use the fact that a much lower filter cost is possible with block-based resampling to increase the filter length. The total error will be lower, at a lower computational cost than the replaced system (the standard method). It is easily seen that there are many new tradeoffs between the resampling error and computational complexity, when block-based resampling is used in conjunction with efficient convolution algorithms.

By using different versions of the block-based resampling algorithm, with the associated modifications described above, it is possible to find solutions to a lot of resampling problems which have a significantly lower computational cost than the prior art methods. For a given computational cost, much better filtering can be achieved, and thereby the resampling error can also be lowered. Filter-limited resampling problems can, with the invention, be transformed into distortion-limited problems.

In certain resampling applications, when high sample rates are involved, lowering the computational cost can be of high priority. Block-based resampling can in those cases be a crucial tool for obtaining this lower cost. In other applications, where combined resampling and pulse-matching is used, long filters are necessary, which implies that a significantly lower computational cost could be obtained by using a block-based resampling algorithm.

It will be understood by those skilled in the art that various modifications and changes may be made to the present invention without departure from the scope thereof, which is defined by the appended claims.

What is claimed is:

1. An arbitrary sample rate conversion method, including the steps of:
   forming blocks of input samples having a first sample rate;
   selecting, for each block of input samples, a subfilter from a polyphase filter; and
   block convolving each block of input samples with the corresponding selected subfilter to produce blocks of output samples having a second sample rate.

2. The method of claim 1, wherein the block convolving step implements a fast convolution algorithm.

3. The method of claim 2, wherein the fast convolution algorithm is based on at least one of a fast Fourier transform, a number theoretical transform, a Winograd short convolution algorithm, a Cook-Toom algorithm, and an iterated algorithm.

4. The method of claim 1, wherein the method implements an irrational sample rate conversion having a conversion ratio near unity and an exact rational sample rate conversion.

5. The method of claim 1, wherein the method implements a combination of a separate exact integer factor interpolation, an irrational sample rate conversion based on block convolution and having a conversion ratio near unity, and a separate exact integer factor decimation.

6. The method of claim 1, wherein the method implements a combination of a separate exact interpolation and an irrational sample rate conversion based on block convolution and including integer factor decimation.

7. An arbitrary sample rate conversion method, including the steps of:
   forming blocks of input samples having a first sample rate;
   selecting, for each block of input samples, a subfilter from a polyphase filter;
   reversing an order of the samples in an input sample block if a delay associated with the corresponding selected subfilter is not less than half of a time separation between input samples;
   block convolving each block of input samples with the corresponding selected subfilter to produce blocks of output samples having a second sample rate; and
   reversing the order of the samples in an output sample block if the delay associated with the corresponding selected subfilter is not less than half of the time separation between input samples.

8. The method of claim 7, wherein the block convolving step implements a fast convolution algorithm.

9. The method of claim 8, wherein the fast convolution algorithm is based on at least one of a fast Fourier transform, a number theoretical transform, a Winograd short convolution algorithm, a Cook-Toom algorithm, and an iterated algorithm.

10. The method of claim 7, wherein the method implements an irrational sample rate conversion having a conversion ratio near unity and an exact rational sample rate conversion.

11. The method of claim 7, wherein the method implements a combination of a separate exact integer factor interpolation, an irrational sample rate conversion based on block convolution and having a conversion ratio near unity, and a separate exact integer factor decimation.

12. The method of claim 7, wherein the method implements a combination of a separate exact interpolation and an irrational sample rate conversion based on block convolution and including an integer factor decimation.

13. An arbitrary sample rate conversion apparatus, including:
   a block former, wherein the block former produces blocks of input samples having a first sample rate;
   a subfilter selector, wherein the subfilter selector selects, for blocks of input samples produced by the block former, subfilters from a polyphase filter; and
   a block convolver, wherein the block convolver convolves blocks of input samples with corresponding selected subfilters and produces blocks of output samples having a second sample rate.

14. The apparatus of claim 13, wherein the block convolver implements a fast convolution algorithm.

15. The apparatus of claim 14, wherein the block convolver implements at least one of a fast Fourier transform, a number theoretical transform, a Winograd short convolution algorithm, a Cook-Toom algorithm, and an iterated algorithm.

16. The apparatus of claim 13, further including an irrational sample rate converter, wherein the irrational sample rate converter has a conversion ratio near unity and implements exact rational sample rate conversion.

17. The apparatus of claims 13, further including a combination of a separate exact integer factor interpolator, an irrational sample rate converter based on block convolution and having a conversion ratio near unity, and a separate exact integer factor decimator.

18. The apparatus of claim 13, further including a combination of a separate exact interpolator and an irrational sample rate converter based on block convolution and including an integer factor decimator.

19. An arbitrary sample rate conversion apparatus, including:
- a block former, wherein the block former produces blocks of input samples having a first sample rate;
- a subfilter selector, wherein the subfilter selector selects subfilters from a polyphase filter for corresponding blocks of input samples produced by the block former;
- an input order reverser, wherein the input order reverser reverses orders of samples in input sample blocks produced by the block former if delays associated with the corresponding selected subfilters are not less than half of a time separation between input samples;
- a block convolver, wherein the block convolver convolves blocks of input samples with corresponding selected subfilters to produce blocks of output samples having a second sample rate; and
- an output order reverser, wherein the output order reverser reverses orders of samples in output sample blocks if the delays associated with the corresponding selected subfilters are not less than half the time separation between input samples.

20. The apparatus of claim 19, wherein the block convolver implements a fast convolution algorithm.

21. The apparatus of claim 20, wherein the block convolver implements at least one of a fast Fourier transform, a number theoretical transform, a Winograd short convolution algorithm, a Cook-Toom algorithm, and an iterated algorithm.

22. The apparatus of claim 19, further including an irrational sample rate converter having a conversion ratio near unity and implementing an exact rational sample rate conversion.

23. The apparatus of claims 19, further including a combination of a separate exact integer factor interpolator, an irrational sample rate converter based on block convolution and having a conversion ratio near unity, and a separate exact integer factor decimator.

24. The apparatus of claim 19, further including a combination of a separate exact interpolator and an irrational sample rate converter based on block convolution and including an integer factor decimator.

* * * * *